(12) United States Patent  
Pan

(10) Patent No.: US 9,129,832 B2  
(45) Date of Patent: Sep. 8, 2015

(54) LED MULTI-CHIP BONDING DIE AND LIGHT STRIP USING THE SAME

(76) Inventor: Dingguo Pan, Shanghai (CN)

( * ) Notice: Subject to any disclaimer, the term of this patent is extended or adjusted under 35 U.S.C. 154(b) by 138 days.

(21) Appl. No.: 13/060,848

(22) PCT Filed: Aug. 26, 2008

(86) PCT No.: PCT/CN2008/001533
§ 371 (c)(1),
(2), (4) Date: May 10, 2011

(87) PCT Pub. No.: WO2010/022538
PCT Pub. Date: Mar. 4, 2010

(65) Prior Publication Data
US 2011/0210349 A1 Sep. 1, 2011

(51) Int. Cl.
*F21S 4/00* (2006.01)
*F21V 21/00* (2006.01)
*H01L 25/075* (2006.01)
*H01L 23/00* (2006.01)
(Continued)

(52) U.S. Cl.
CPC ............ *H01L 25/0753* (2013.01); *H01L 24/97* (2013.01); *F21Y 2101/02* (2013.01); *F21Y 2105/001* (2013.01); *H01L 2224/45144* (2013.01); *H01L 2224/48091* (2013.01); *H01L 2924/12041* (2013.01)

(58) Field of Classification Search
CPC ................. H01L 2924/00; H01L 2224/48465; H01L 25/0753; H01L 2224/49175; H01L 2224/97; F21Y 2103/003; H05K 2201/10106; F21V 23/06; F21V 21/005
USPC ............ 257/88; 362/249.01, 249.02, 249.03, 362/249.04, 249.05; 439/490
See application file for complete search history.

(56) References Cited

U.S. PATENT DOCUMENTS 4,661,654 A * 4/1987 Strobel .......................... 174/263
6,505,956 B1 * 1/2003 Priddy et al. ............. 362/249.04
(Continued)

FOREIGN PATENT DOCUMENTS

CN 201000001 1/2008
JP 2006-253336 9/2006

OTHER PUBLICATIONS

International Search Report for international application No. PCT/CN2008/001533, dated May 21, 2009 (4 pages).

*Primary Examiner* — Kenneth Parker
*Assistant Examiner* — David Chen
(74) *Attorney, Agent, or Firm* — Hamre, Schumann, Mueller & Larson, P.C.

(57) ABSTRACT

An LED multi-chip bonding die (1) comprises a packaging enclosure, a plurality of LED chips and a packaging cover, wherein the chips are arranged in one line from top to bottom on the emitting platform. Large area electrodes are equipped on the packaging enclosure and the packaging cover is made of transparent silicone gel so that the bonding die can emit larger light energy and higher luminance via the packaging cover while the heat produced by the chips can be quickly dissipated by the electrodes. A light strip (20) equipped with the bonding die comprises a plurality of bonding die sections and circuit board (2) and each bonding die section (1) comprises four LED multi-chip bonding dies (1) and a current-limiting resistor in series circuit. Each series circuit is connected in parallel and circuit board (2) is printed circuit board which can provide a optimal heat-dissipating structure for chips of bonding die.

10 Claims, 7 Drawing Sheets

(51) Int. Cl.
*F21Y 101/02* (2006.01)
*F21Y 105/00* (2006.01)

(56) References Cited

U.S. PATENT DOCUMENTS

| | | | |
|---|---|---|---|
| 7,025,651 B2 | 4/2006 | Song et al. | |
| 2003/0112627 A1* | 6/2003 | Deese | 362/249 |
| 2005/0056092 A1* | 3/2005 | Kowalski | 73/313 |
| 2005/0231947 A1* | 10/2005 | Sloan et al. | 362/235 |
| 2005/0239342 A1* | 10/2005 | Moriyama et al. | 439/699.2 |
| 2008/0002100 A1* | 1/2008 | Kaneko et al. | 349/65 |
| 2008/0123367 A1* | 5/2008 | Pan et al. | 362/628 |
| 2008/0137332 A1* | 6/2008 | Lo et al. | 362/240 |
| 2008/0220548 A1* | 9/2008 | Chan et al. | 438/26 |
| 2009/0109668 A1* | 4/2009 | Isobe | 362/231 |

* cited by examiner

LED MULTI-CHIP BONDING DIE AND LIGHT STRIP USING THE SAME

TECHNICAL FIELD

This invention relates to a light emitting diode (LED) and more particularly to an LED multi-chip bonding die useful for light-reflecting plate with triangular prisms and to a light strip using the same. The bonding die is packaged with a plurality of LED chips.

TECHNICAL BACKGROUND

Under the pressure from demands which exceed supplies and increasing price of energy resources, the lighting industry hopes to seek for some lighting fixtures ideal both for lighting and energy conservation. Therefore, LED lighting fixtures appear and begin to substitute incandescent lamps and compact fluorescent lamps. To ensure extensive application and popularization of LED lighting fixtures, many scientific and technical staffs in this field and relevant fields have researched and developed high power LED light sources and published massive research articles and laboratory reports. From these experiments and the current status of products produced or sold, people find that the major technical barriers still exist with high power LED design and application in terms of optical efficiency and heat dissipation.

Summing up the application of LED in lighting industry, what we realize is that we may not understand the nature of LED. What we pursue for is usually how to enlarge the digital value of an LED package lumen (luminous flux), but we often ignore how to deal with heat dissipation. How can an LED lighting fixture reach its ideal lumen and how can heat be dissipated? Further, how can the lumen be maintained? These are the directions of our study.

The applicant of this invention proposes to use all lamp bodies as light source in the previous inventions for light-reflecting plate with triangular section prisms and circular plate lamps. The lamp bodies include LED, which is used as the light engine of the area light source for the light-reflecting plate and circular plate lamps. To make LED light source to adapt to the requirements for the light-reflecting plate and the circular plate lamps, a plurality of LEDs are installed on a circuit board to make a lamp assembly. Although these preliminarily proposed LED light sources and lamp assemblies solve the problem of lighting efficiency and energy conservation in LED application, but some shortcomings still exist in the comprehensive performance such as luminous efficiency and heat dissipation. Therefore, improvement is required accordingly.

SUMMARY OF THE INVENTION

The objective of the present invention is to overcome the disadvantages of the prior art and to provide a micro LED multi-chip bonding die comprising a plurality of packaged LED chips and a light strip made therefrom. These bonding dies and light strips are suitable for a light-reflecting plate with triangular section prisms, especially with isosceles triangular prism having identical section and circular plate lamps.

To achieve the above objectives of the present invention, it is provided an LED multi-chip bonding die in the invention, which comprises:

a packaging enclosure made of high temperature-resistant plastics or ceramics, in which a groove with an oval bottom used for mounting LED emitting platform is located in the center of its upper surface;

a plurality of LED chips mounted on the emitting platform and arranged in straight line from top to bottom;

electrodes corresponding to the numbers of the LED chips, these electrodes are arranged symmetrically along the center line on both sides of the lower surface of the packaging enclosure so that the LED chips are connected with the electrodes via the lead wires of the chips; and a packaging cover formed by silicone gel that is filled in the groove and covers over a plurality of LED chips.

In one embodiment of the multi-chip bonding die as mentioned above, the plurality of LED multi-chips mounted on the emitting platform in straight line arrangement are square and have 2 to 8 chips, wherein the distance between chip centers is 0.5-1.1 mm and the connection lines of geometric center coincide completely with the center line OO" of the packaging enclosure.

In one embodiment of the multi-chip bonding die as mentioned above, the electrodes extend respectively from the lower surface of the packaging enclosure upward to the lower part of the two side walls.

In one embodiment of the multi-chip bonding die as mentioned above, each electrode of the packaging enclosure is horizontally distributed on the lower surface and has equal area.

In one embodiment of the multi-chip bonding die as mentioned above, each electrode of the packaging enclosure is distributed in right angle on the lower surface and the lower part of the two side walls and has equal area.

In one embodiment of the multi-chip bonding die as mentioned above, the external shape of the packaging enclosure is square or rectangular and the groove of the packaging enclosure is square, rectangular or oval.

In one embodiment of the multi-chip bonding die as mentioned above, the LED chips are paired in parallel, wherein the positive and negative poles in parallel connection are welded to electrodes, respectively.

In the invention, a light strip made of LED multi-chip bonding die comprises:

a plurality of bonding die sections, wherein each section comprises 4 LED multi-chip bonding dies and a current-limiting resistor in series connection, and each bonding die section is connected in parallel;

a strip-like circuit board, wherein one of the surfaces of the circuit board is divided into lower and upper parts by height; on the upper part is equipped with power terminal through-hole contacts, through-hole weld joints for current-limiting resistor and through-hole weld joints for connection cable of negative pole, while on the lower part is equipped with a pad for power electrode of a plurality of LED multi-chip bonding dies; heat-dissipating copper sheet is equipped on the part of another surface of the circuit board where it is placed back-to-back with the electrode of the LED power;

the LED multi-chip bonding dies for each bonding die section are installed at certain interval on the LED power electrode of the circuit board, wherein the positive and negative poles of the LED multi-chip bonding dies are connected with the through-hole contacts of the power terminal and the through-hole weld joints of the connection cable of negative pole, respectively; and the current-limiting resistor is welded with the through-hole weld joint of the current-limiting resistor and is connected between the two LED multi-chip bonding dies connected in series in each bonding die section.

In one embodiment of the Light strip as mentioned above, the upper part equipped with through-hole contact for power terminal, through-hole weld joint of current-limiting resistor and through-hole weld joint for connection cable of negative pole occupies 20-50% of the upper surface area; and the lower part equipped with a plurality of LED power electrodes occupies 80-50% of the upper surface area.

In one embodiment of the Light strip as mentioned above, the LED power electrode is copper pad and the through-hole contact for power terminal, through-hole weld joint of current-limiting resistor and through-hole weld joint for connection cable of negative pole are on a through-hole pad.

In one embodiment of the Light strip as mentioned above, the circuit board is a compound board or PCB with bakelite plate as the stratum and both sides thereof are covered with some copper sheets used as heat radiating fin and power electrode for a plurality of LED bonding dies; and the thickness of circuit board is less than 1 mm.

In sum, the bonding die of the present invention comprises a packaging enclosure, a plurality of LED chips and a packaging cover, wherein the chips are arranged in straight line from top to bottom and installed on the emitting platform, the lower surface of the packaging enclosure is equipped with large-area electrode, the packaging cover is made of silicone gel having favorable transparency so that each bonding die can emit the high light energy and better lamination is achieved with the light energy essentially transmitting through the packaging cover, and the heat produced when chips are conducted can be quickly transferred or conducted to the electrode located at the lower part, which is favorable for heat radiation. The light strip equipped with the foregoing bonding die chips comprises several bonding die sections and circuit board; each bonding die section comprises a series circuit having four LED multi-chip bonding dies and a current-limiting resistor. The series circuits of the individual bonding die sections are connected in parallel. The circuit board is printed circuit board, one surface of which is divided into the upper and lower parts by height. On the upper part is equipped with power terminal through-hole contact, through-hole weld joint for current-limiting resistor and through-hole weld joint for the connection cable of negative pole, while on the lower part is equipped with a plurality of LED bonding die power electrode pad consisting of heat-dissipating copper sheets and electricity-conducting and heat-dissipating part which is back to the LED power electrode pad, thereby providing best heat-dissipating structure for the chips on bonding die.

We have found that the lighting industry needs an area light source, not a point light source. The aforesaid invention of the applicant is to provide a optical engine for the isosceles triangular prisms having equal section that are used as the optical prism in the light-reflecting plate and circular plate lamps, thereby achieving illumination with area light source.

BRIEF DESCRIPTIONS OF THE DRAWINGS

FIG. 1b is the sectional view along line C-C of FIG. 1a.

FIG. 1c is the bottom view of FIG. 1a.

FIG. 2b is the sectional view along line A-A of FIG. 2a.

FIG. 2c is the bottom view of FIG. 2a.

Embodiments

Figure 1A:
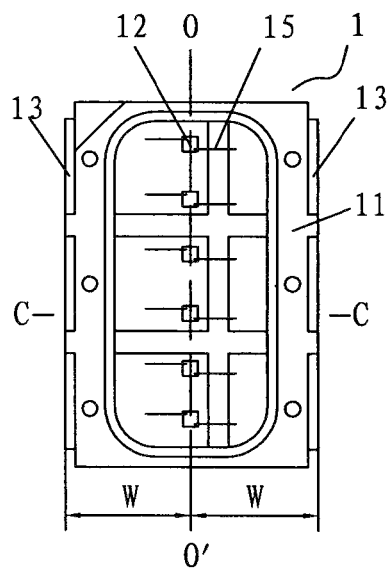
FIG. 1a is a sectional view of the oval bonding die package of the six LEDs, mainly showing the arrangement structure of these chips within the packaging enclosure.
Figure 2A:
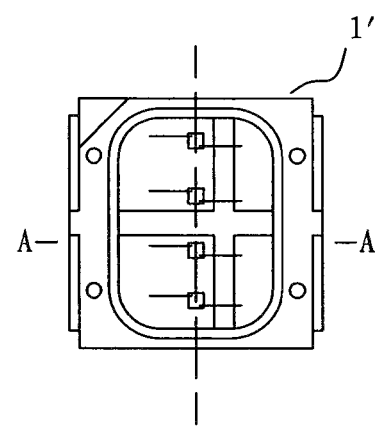
FIG. 2a is a sectional view for the oval bonding die having four LED chips, mainly indicating the arrangement structure of these chips within the packaging enclosure.
Figure 1B:
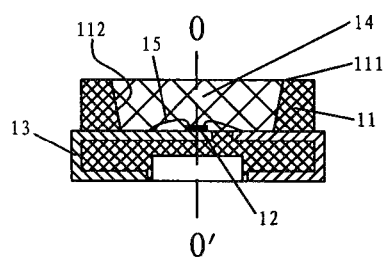
Figure 2B:
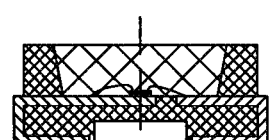
Figure 1C:
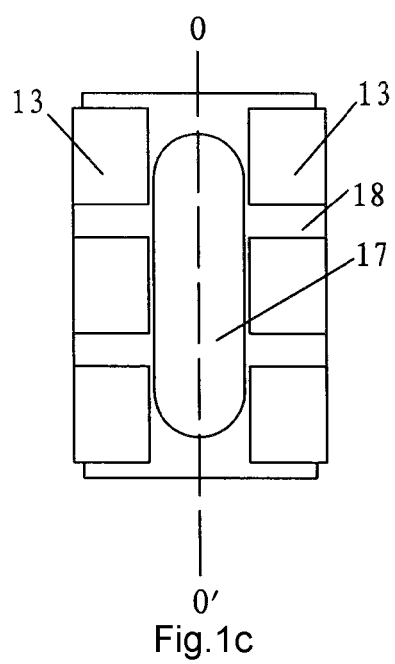
Figure 2C:
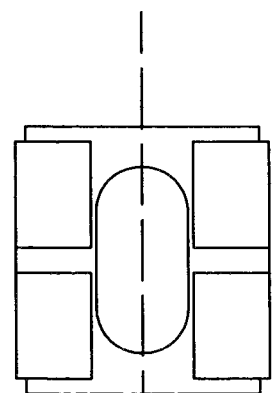

Refer to FIG. 1a to FIG. 2c, wherein the 3 views for the two structural distributions of the packaged LED multi-chip bonding die of the present invention are displayed. FIG. 1a to FIG. 1c show the distributed architecture of the bonding die equipped with six LED chips and FIG. 2a to FIG. 2c show the distributed architecture of the bonding die equipped with four LED chips. Whether they are 6 chips or 4 chips, the difference lies only in that different numbers of chips in multi-chip bonding die result in different numbers of electrodes and different light energy, but their architectures are essentially the same, except for their volume. Therefore, the embodiment of the invention is illustrated using the bonding die with six LED chips as an example.

The LED multi-chip bonding die 1 of the present invention comprises six LED chips 12, an electrode 13 and a packaging cover 14, wherein the upper surface 111 of the packaging enclosure 11 is equipped with a groove 112, the bottom face of which is used to install the emitting platform for LED light rays (hereinafter "emitting platform"). Preferably, the groove 112 is of oval shape and the bottom platform is also oval accordingly. In general, the packaging enclosure 11 is made of high-temperature-resistant plastic or ceramic materials.

The six LED chips 12 are arranged in a straight line array from top to bottom, installed on the emitting platform and placed at the axial symmetric center of the overall oval platform. Moreover, in this embodiment, the six LED chips are all square, the geometric centers of which coincide completely with the center line OO' of the packaging enclosure. According to the requirements, the six chips can be arranged, for example, 0.8 mm from the center per actual situations and are packaged in straight line with each chip being vertical to the horizontal plane.

The six electrodes 13 are arranged symmetrically on both sides of the lower surface of the packaging enclosure along with the center line OO', wherein the electrodes of bonding die are also the weld leg of the power supply. Each electrode 13 is of the same width and therefore the current obtained by the chips is equal. Each chip is connected with electrode 13 via chip lead wire, such as gold wire 15. In this embodiment, the six LED chips are paired in parallel, forming 3 positive and 3 negative poles, totally 6 poles. Therefore, they are welded with the 6 electrodes 13, respectively. Each electrode 13 of the foregoing packaging enclosure is placed on the lower surface, the external surface of which is arranged on plane having equal area. In addition, the electrode 13 also extends respectively from the lower surface of the packaging enclosure 11 upward to the lower part of the two side walls. Therefore, each electrode of the packaging enclosure forms an electrode distributed in right angle formed by two vertical planes on the lower surface and the lower part of the two side walls and each electrode has the equal area. Thus, the current obtained for the chips is equal. Moreover, since PN is closely attached with metal electrode, the metal electrode takes away the heat immediately after heat is generated by PN joint. Further, more heat is taken away because the electrode is distributed on plane.

Packaging cover 14 is formed by filling the silicone gel (preferably silicone gel favorably used for light emission and heat-dissipating optical fillings) into the groove and covering the six LED chips 12. Therefore, a thin layer of silicone gel is covered on the chip emitting surface of the oval plane of the packaging enclosure 1 that is packaged by plastics or ceramics.

The six LED chips 12 can be paired in parallel, the positive and negative poles after being paired in parallel are welded on electrodes. However, the six LED chips 12 can not be first connected in parallel. Otherwise, there will be 12 positive and negative poles. Accordingly, 12 electrodes should be equipped on the bottom surface of the packaging enclosure so as to reduce the overall area of the electrodes, thereby unfavorable for heat dissipation.

Usually, the height of the packaging enclosure 11 is lower than or equal to 2 mm and the thickness of the packaging cover is less than 1 mm. A key groove 17 is equipped in the center position between the electrodes 13 on both sides of the lower surface of the packaging enclosure. Preferably, the adjacent face of the electrode 13 symmetrically arranged on both sides of the lower surface is separated and positioned by plastic sealed boss having the same height.

The multi-chip LED bonding dies made according to the above process are of low power and low current. Each multi-chip LED bonding die has a power of 0.01-0.5 w, so as to fit the need of light-reflecting plates with micro prisms having same cross section of scalene triangle, wherein the plates have different sizes and different gauges for powers.

Refer to FIGS. 3-6. The light strip 20 made from the foregoing LED multi-chip bonding dies comprises a plurality of bonding die sections N, a strip-like printed circuit board (PCB) 2, and a current-limiting resistor R. Each bonding die section 10 of the plurality of bonding die sections N comprises four LED multi-chip bonding dies connected in series (There are six or four multi-chip bonding die and the difference lies only in that the number of chips and the size of structure are different. However, the principle is the same. In this embodiment, six LED chips are taken as the example and the drawings for the four LED chips are only for reference). Each bonding die section N is connected in parallel.

Figure 5:
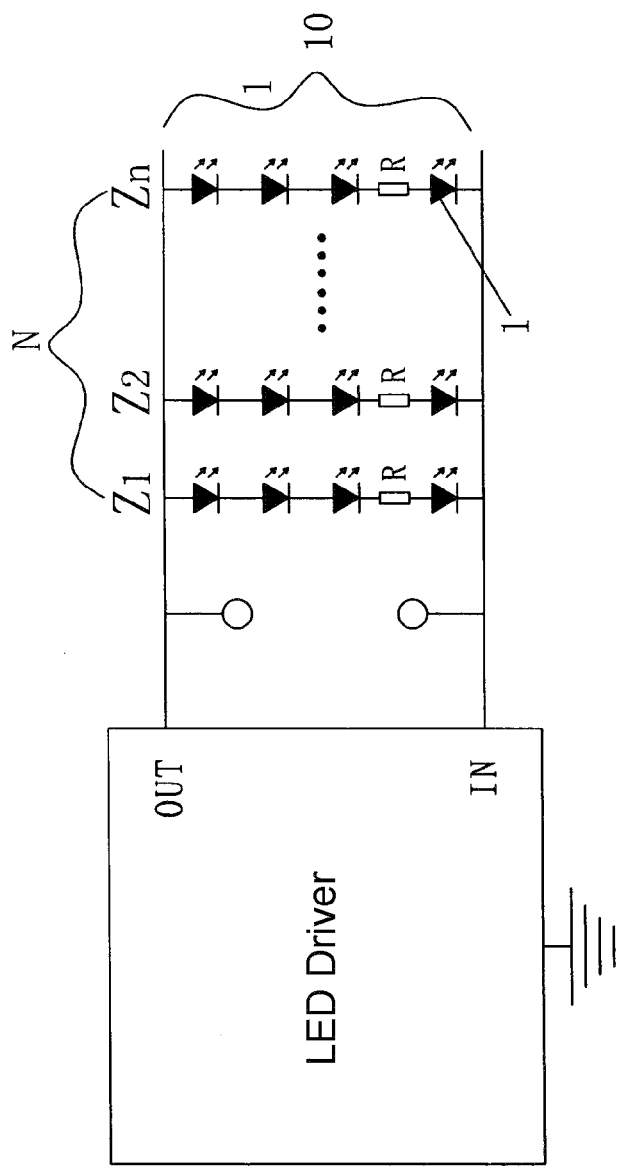
FIG. 5 is the circuit diagram for the series connection for one bonding die section comprising four LED multi-chip bonding dies and a current-limiting resistor, the parallel connection for a plurality of the same bonding die sections and connection with LED driver by input and output terminals after parallel connection.
Figure 6:
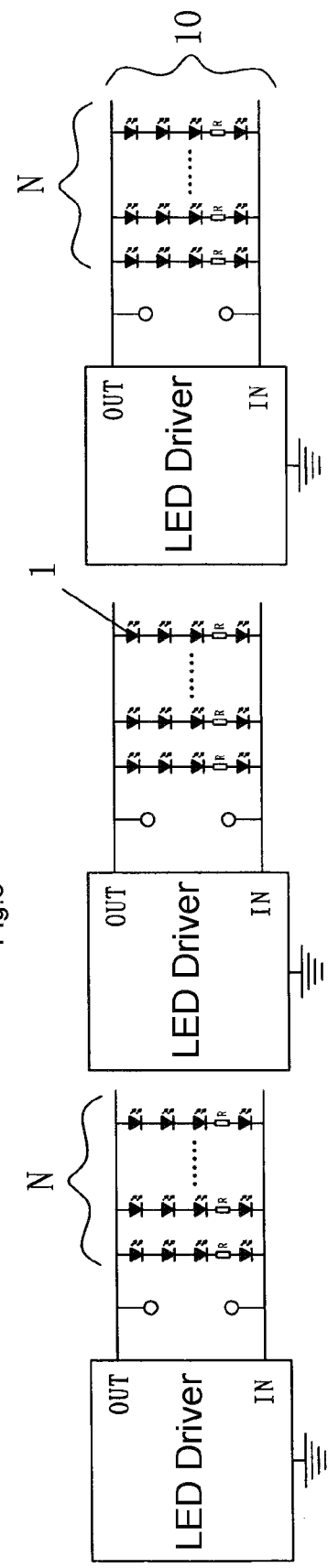
FIG. 6 is the structural drawing for three same groups of circuit diagram of FIG. 5 driven by LED multi-chip bonding dies, showing that driving circuit comprises three independent bonding die sections connected in series and several bonding die sections connected in parallel in a light-reflecting plate having sectional triangular prism.

Refer to FIG. 5 and FIG. 6 which show the typical circuit diagram of LED multi-chip bonding dies 1 and its light strip 20 made therefrom. This is a series-plus-parallel circuit. Lighting fixture requires for low voltage and the drive voltage adopted here is DC 12V. The circuit for each bonding die section 10 is Z1, Z2, ..., Zn (branches of the parallel circuit). LED multi-chip bonding dies 1 is connected in series in the branch and R is the current-limiting resistor of the branch. The advantage of this circuit is that even if one of the LEDs does not function, only one branch stops operating and the remaining branches function normally. FIG. 6 shows the circuit driven by 3 drivers, which may lead to increase in cost, but due to provision of an aluminum frame for uniform heat dissipation in this invention, the current for all branches is even. The advantage of using 3 or more drivers is that even if some individual drivers are damaged, the remaining ones will keep functioning normally.

Figure 7:
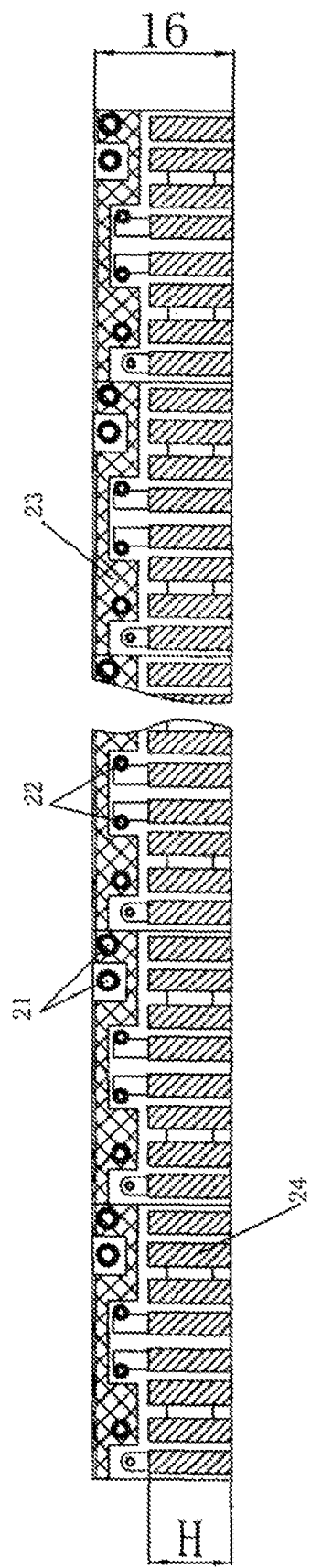
FIG. 7 is the Pareto diagram for the wiring welding joints when the packaged LED multi-chip bonding dies are installed on the 16 mm-wide circuit board.
Figure 9:
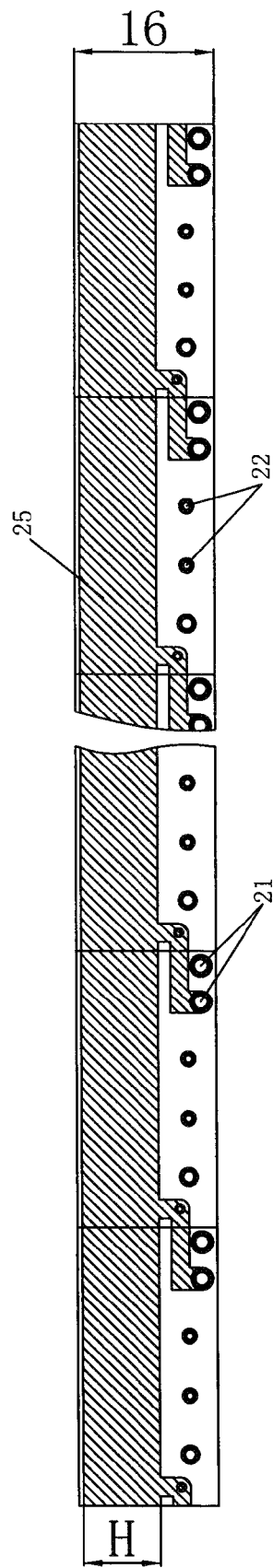
FIG. 9 is the structural layout plan for the back of the circuit board of FIG. 7.

Please refer to FIG. 7 and FIG. 9 which show the strip-like circuit board 2 with height of 16 mm and 8 mm, respectively. One of their surfaces is divided into the upper part and lower part by height. On the upper part is equipped with power terminal contacts 21, weld joints 22 for current-limiting resistor and weld joints 23 for connection cable of negative pole. Heat-dissipating fin 25 is equipped on the part of another surface of the circuit board where it is placed back-to-back with the electrode of the LED power. In fact, the LED power electrode pad 24 is a copper pad and the power terminal contacts 21, weld joints 22 for current-limiting resistor and weld joints 23 for connection cable of negative pole are of through-hole pads.

When each bonding die section 10 is welded on the circuit board 2, the LED multi-chip bonding dies 1 of each bonding die section 10 are welded on LED power electrode pad 24 at certain interval and in sequence. The positive and negative poles of the LED multi-chip bonding dies are connected with power terminal contacts 21, weld joints 23 for connection cable of negative pole. The current-limiting resistor R is welded at the weld joint 22 of the current-limiting resistor and is connected between the two LED multi-chip bonding dies connected in series in each bonding die section.

After multi-chip bonding die PCB light strip 20 is properly assembled, it will be used as the important component for the LED plate lamp (or sheet lamp) with isosceles triangular prisms having equal section and LED circular plate lamp. Those lamps will be described in details hereinafter. If we regard the LED plate lamp with isosceles triangular prisms having equal section and the LED circular plate lamps (The light strips are equipped on lamps.) as a large LED packaging element, then the LED multi-chip bonding dies 1 and the PCB light strip made therefrom constitute integral parts of the plate lamps and circular plate lamps. All properties of the multi-chip bonding die light strip are subject to the prism light-reflecting plate and the circular plate lamp piece and light strip will favorably function as the power source for the optical engine of the area light source.

It must be understood that to meet the requirements for the grooves of the plate lamps or circular plate lamps, the light strip 20 for the plate lamp is installed in a straight-line groove, measured in length L, and in the circular plate lamp, the light strip 20 is installed in circular groove, measured in its circumference c. The overall circuit is divided into a plurality of bonding die sections N due to the special circuit design requirements for the lighting fixture. The N sections use 12V DC current and are connected in parallel, but for each bonding die section, 4 bonding dies are connected with one current-limiting resistor in series. Therefore, the length L or circumference c of the light strip 2 of the plate or circular plate lamps can be calculated by the length δ of each bonding die section or the diameter D of the groove (also the diameter of the circuit board matched with the groove). For example, the length of the light strip of the plate lamp can calculated by $L=\delta \times N$ and that for the circular plate lamp can be calculated by $C=\pi \times D$. If the circumference of the circular plate lamp equals to the sum of the length of N sections ($\delta \times N$, e.g., $\delta=30$mm, N is 20), then equation $\pi \times D = N \times \delta$ is used to calculate the diameter of the circuit board matched with the groove, i.e., $D=N \cdot \delta/\pi$. Obviously, the length and diameter of the circular plate lamps or plate lamps can be determined only after their power is determined. Due to restriction by the length of each bonding die section (section length), the section length must be taken into consideration in determining the power of the lighting fixture.

Figure 3:
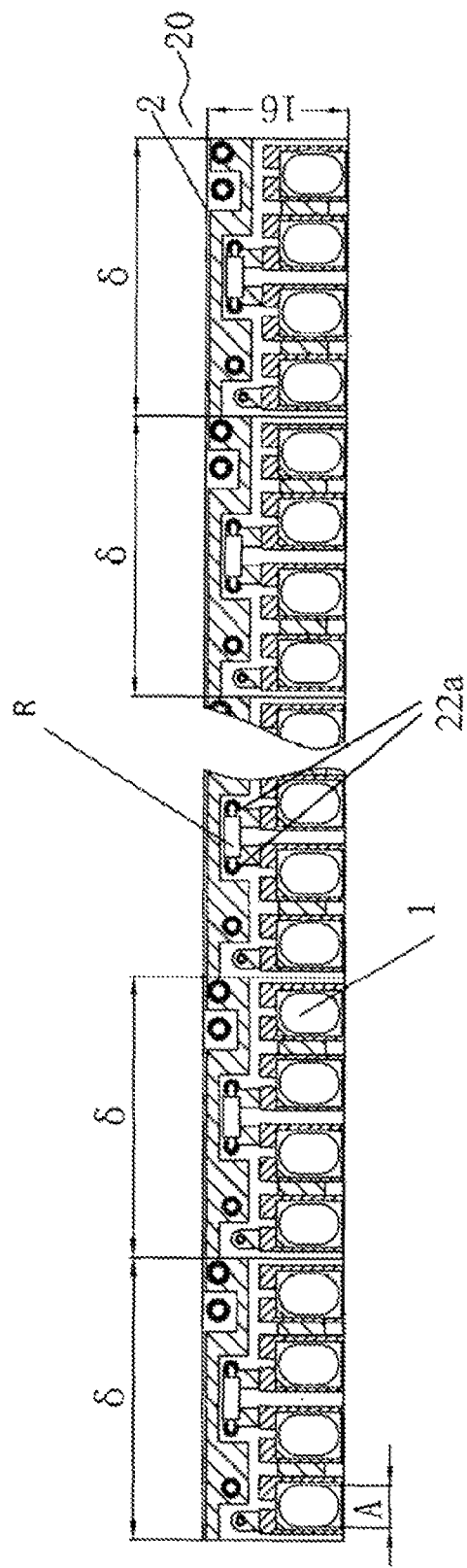
FIG. 3 is the assembly drawing for one of the light strips comprising 16 mm-wide strip-like circuit board and a plurality of LED multi-chip bonding dies.
Figure 4:
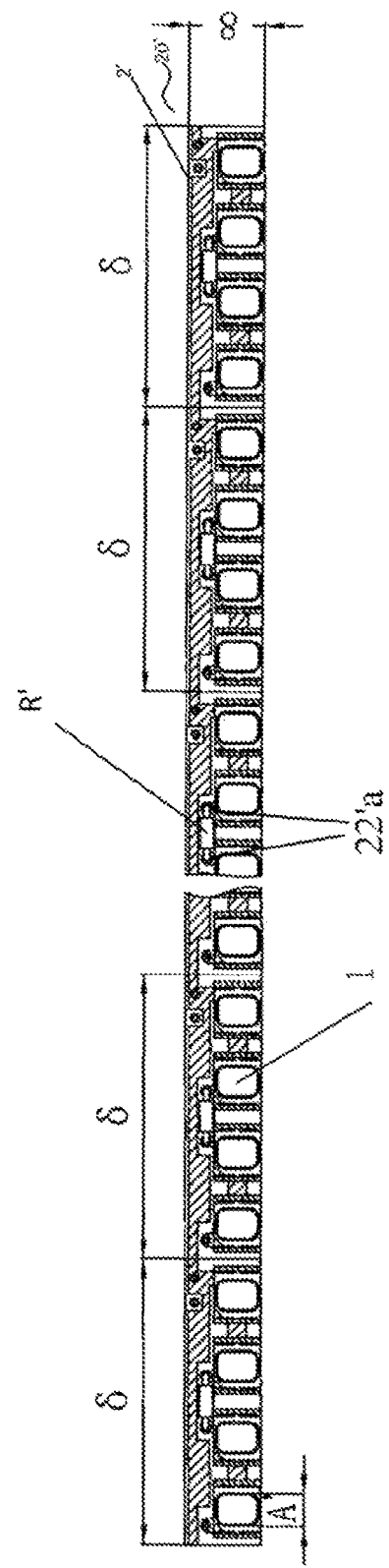
FIG. 4 is the assembly drawing for one of the light strips comprising 8 mm-wide strip-like circuit board and a plurality of LED multi-chip bonding dies.

As shown in FIG. 3 and FIG. 4, the width of the LED multi-chip bonding die is A and in general, $4A \neq \delta$. A can not be excessively wide. Otherwise, it will influence the power distribution of the lighting fixture and the shaping of the circular lamps with small diameters.

We associate the PCB light strip 20 having LED bonding die with the lamp filament of Edison's incandescent lamps, because they have something in common. Both of them can emit light. However, the light strip 20 in the invention is completely different from the original tungsten filament and can be arranged freely with N sections of light strips. The light strip can be separated from the lamp housing (plate lamps or circular plate lamps) for internal repair, but the bulb filament in the art is absolutely inseparable from the lamp housing.

The vertical straight line design for the foregoing LED chip is to meet the requirements for design of LED lighting fixture. As mentioned hereinbefore during the illustration of FIG. 3, the oval bonding die chips are the light source for the lighting fixture. As mentioned by the applicant in the application titled "an oriented circular light-reflecting plate with triangular micro prisms having identical cross section and a circular plate lamp made therefrom", "the emission plane of the LED intersects with the connection lines of the apices of the triangles and forms an inclusion angle of 90–α". So it is based on the requirements of optical design. Meanwhile, the symmetrical design for LED bonding die chips meets both optical requirements and requirements for power transmission and heat dissipation.

Figure 8:
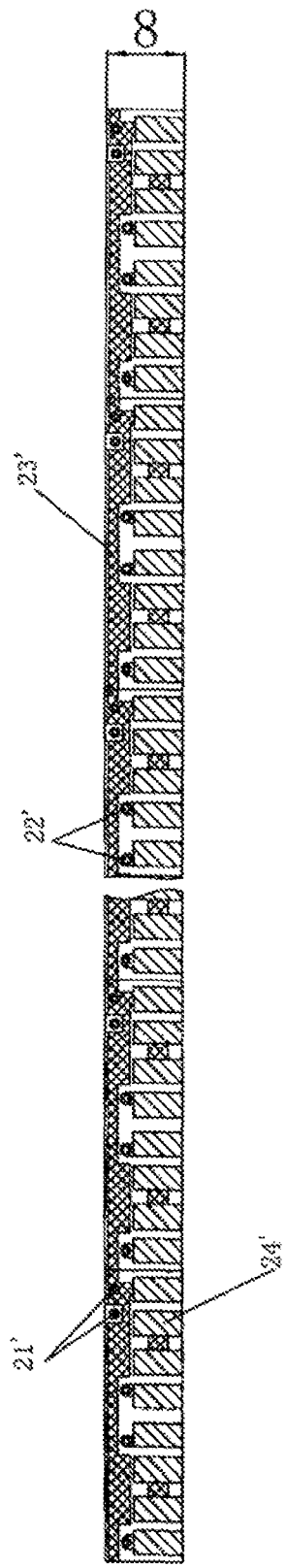
FIG. 8 is the Pareto diagram for the wiring welding joints when the packaged LED multi-chip bonding dies are installed on the 8 mm-wide circuit board.

Please refer to FIG. 7 and FIG. 8. The circuit board in actual use is a compound board with bakelite plate as the stratum and both sides thereof are covered with some copper sheets used as heat radiating fin and power electrode pad for a plurality of LED bonding dies and the thickness of circuit board is less than 1 mm. After processing, the circuit board is divided into an upper part comprising power terminal contact 21, weld joint 22 for current-limiting resistor and weld joint 23 for the connection cable of the negative pole and a lower part equipped with a plurality of LED power electrode pads 24, which occupies 20-50% and 50-80% of the upper surface area, respectively. In this embodiment, the height H indicated in circuit board 2 shows the weld area for LED bonding dies. As far as the overall bonding die plane is concerned, H part occupies ⅗ of the total area and functions as the weld area for LED bonding dies, the LED power electrode and the LED heat dissipating area. The bonding die light strip is 0.8 mm thick and when LED joints generate heat, the heat is immediately transmitted via the electrode 13 to the surface of the PCB pad and then via the bakelite layer of PCB to the heat-dissipating copper sheet 25. Meanwhile, heat can also be transmitted to the copper sheet via the cut-through resistance pad. Referring to FIG. 3, the current-limiting resistor R uses a suspended weld leg 22a to avoid heat accumulation in LED. Referring to FIG. 4, the current-limiting resistor R' uses a suspended weld leg 22'a to avoid heat accumulation in LED.

Figure 10:
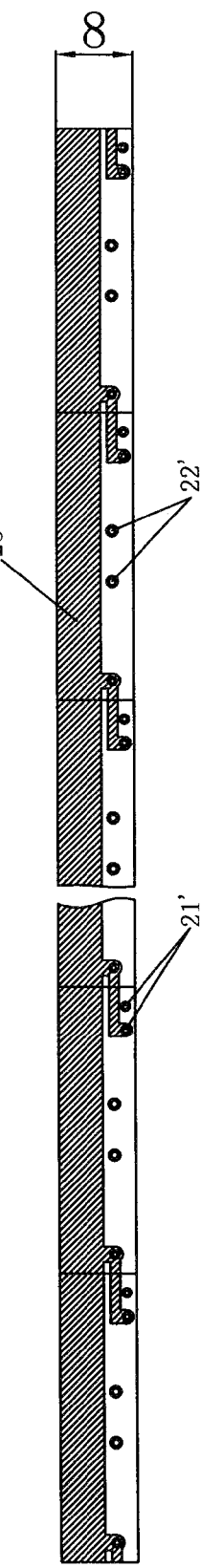
FIG. 10 is the structural layout plan for the back of the circuit board of FIG. 8.

Please refer to FIG. 9 and FIG. 10 which shows the back face of the circuit board of the PCB light strip made of oval LED multi-chip bonding die. The H-height inclination part is the lead wire of the positive pole of the circuit, where it functions as LED heat-dissipating copper sheet to transmit the heat from the PCB to the aluminum alloy lamp frame located on its back via its wide face and to ensure heat dissipation by enabling air convection between the lamp frame and external air. As far as FIG. 7 and FIG. 8 is considered as a whole, "extensive" or "enlarged" heat-dissipating policy is adopted in this invention. The contact, transmission and dissipation area of LED joints are enlarged as much as possible. Compared with traditional bullet-type packaging LED design of 5 mm diameter, this invention enlarges its heat-radiating area by dozen folds, thus resulting in rather ideal heat-dissipating effect.

Figure 11A:
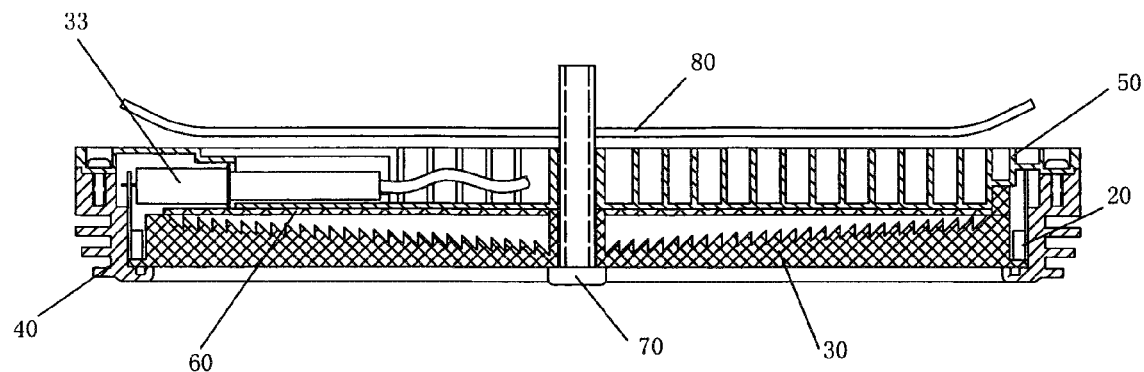
FIG. 11a and FIG. 11b show respectively a sectional view for assembling a circular plate lamp, wherein the light strip in FIG. 3 is installed on the oriented circular light-reflecting plate having isosceles triangular prism with equal section and a plan view after removal of heat-dissipating cover.
Figure 11B:
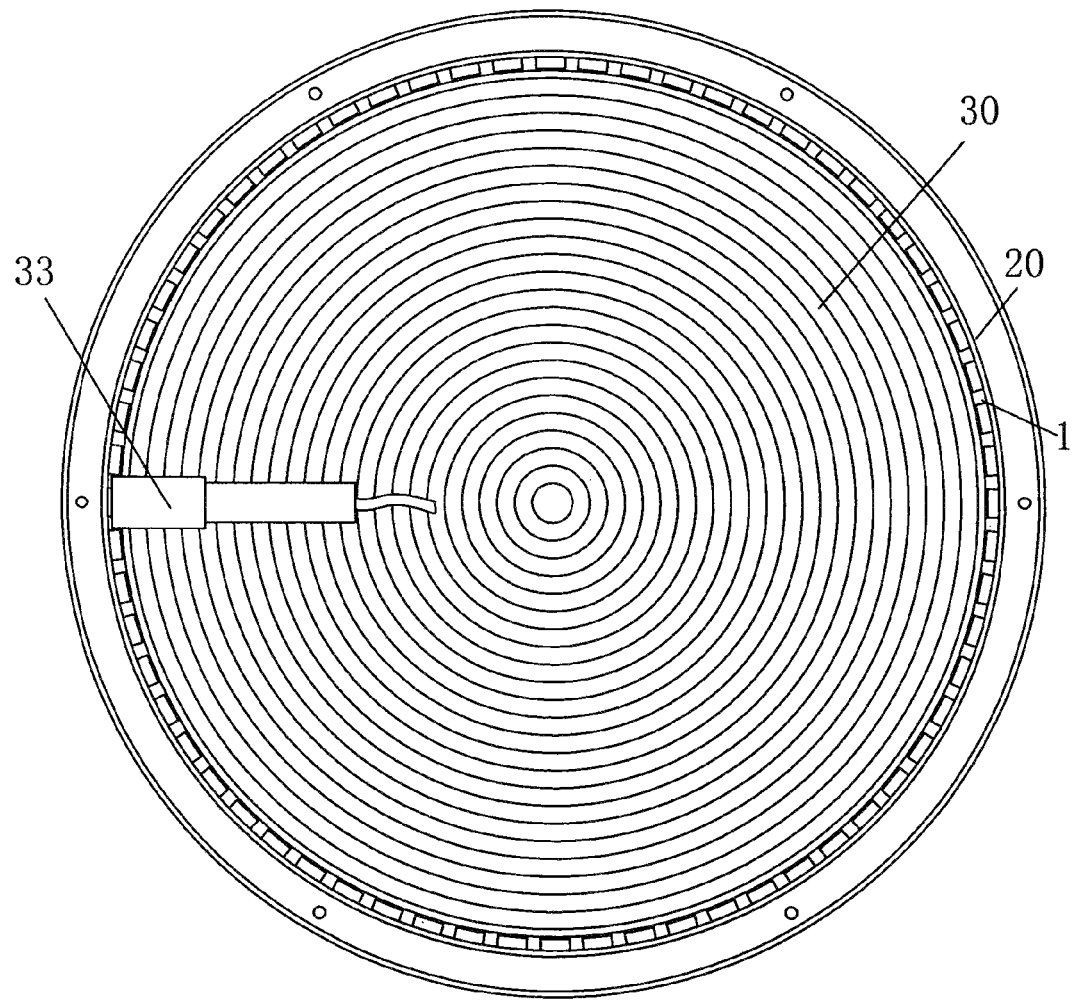

FIG. 11 is an example of application of the invention on circular plate lamp. In addition to the light strip 20, the circular plate lamp also comprises a light-reflecting plate 30, a heat-dissipating frame 40, a heat-radiating fin 50 and a reflecting back plate 60. We will give the illustration from such aspects as point light source, numbers of points and area light source.

Take the circular plate lamp of 180 mm diameter as an example. The power is 5 W and 20 sections of LED oval bonding die chips are arranged in the surrounding groove 52. Each section comprises four chip dies and on the surface of each die are six chip point light sources. Therefore, along the circumference of the circular plate lamp of 180 mm diameter, $6 \times 4 \times 20 = 480$ point light sources are arranged. On the Ø180 mm circular plate lamp, 33 inequilateral prism rings having equal section are arranged. If the LED multi-chip light strip is lighted, the luminous points of all LED bonding die chips around the circular plate lamp will emit lights towards the prism rings and produce $480 \times 33 = 15840$ reflecting beams on the prism surface via total reflection. The light beams exit out of the plane of the circular plate lamp. The clear aperture for Ø180 mm circular plate lamp is 254 cm$^2$, therefore, $15840/254=62$. That is, 62 light beams are reflected in each square centimeter. This unveils the optical and mathematical evolution from 5 W to 15840 light beams and a change from point light source to area light source.

Figure 12A:
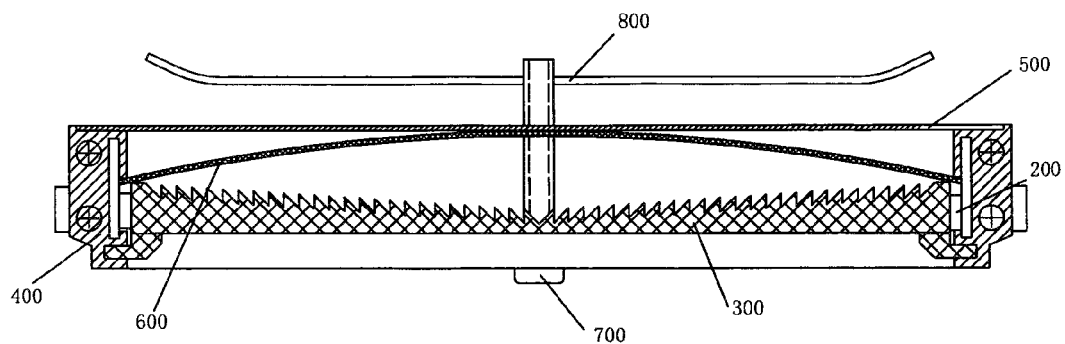
FIG. 12a and FIG. 12b show respectively a sectional view for assembling a circular plate lamp, wherein the light strip in FIG. 4 is installed on the oriented sheet light-reflecting plate having isosceles triangular prism with equal section and a plan view after removal of heat-dissipating cover.
Figure 12B:
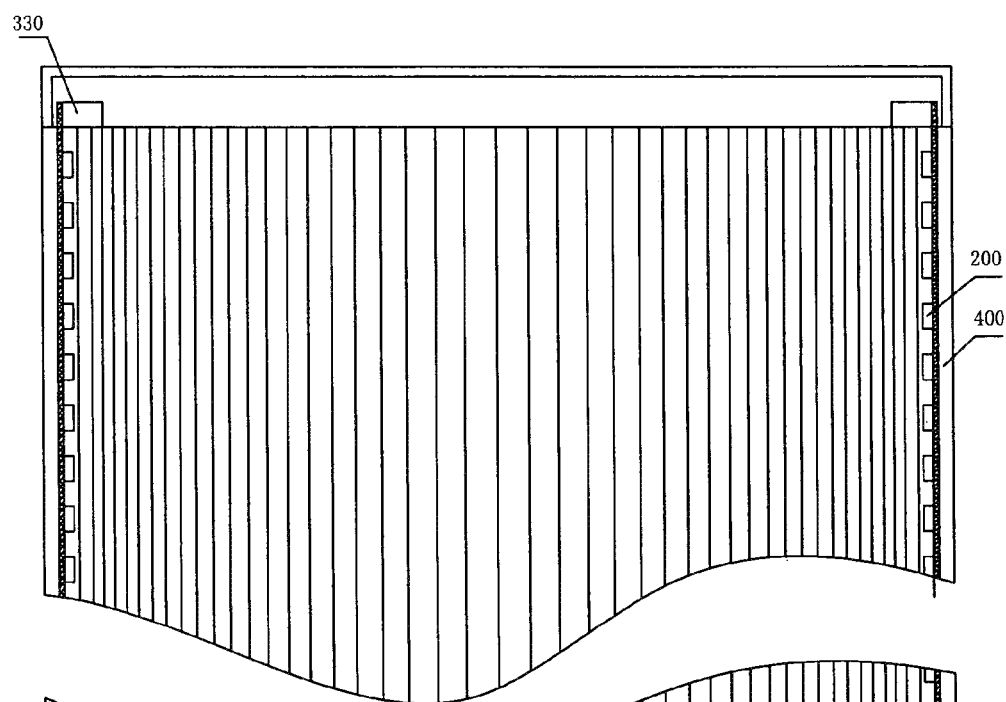
Figure 12B:
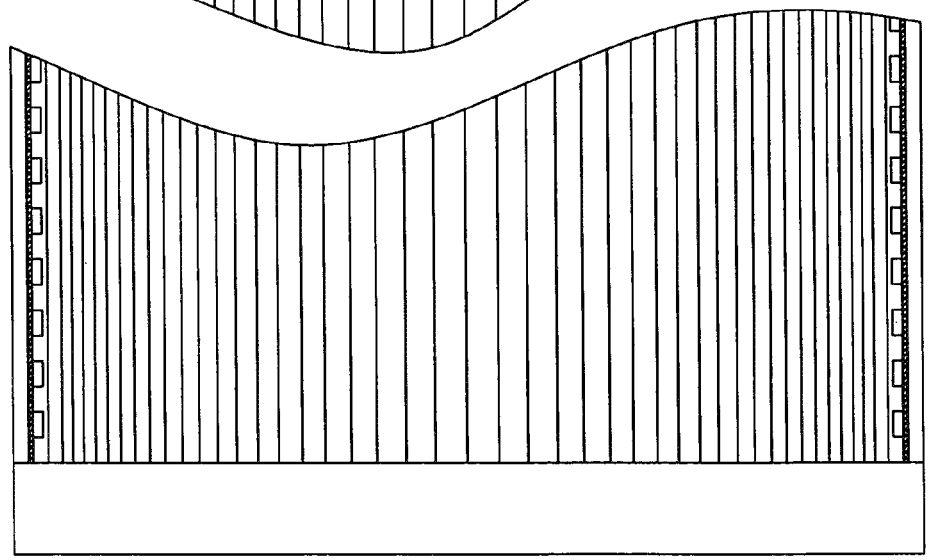

Refer to FIG. 12, which shows a rectangular plate lamp. In addition to the light strip 200, the plate lamp also comprises a streamlined prism light-reflecting plate 300, a heat-dissipating frame 400, a heat-radiating fin 500, and a reflecting back plate 600. The power is 5 W. Several sections of LED bonding dies are arranged in the groove 520 on the both sides. Each section has four chip dies and each chip dies has six point light sources on its surface.

As seen from FIG. 11 and FIG. 12, LED multi-chip bonding die light strip is the backbone for plate lamp and circular plate lamp using isosceles triangular prisms having equal section. The plate lamp and circular plate lamp, in which isosceles triangular prism having equal section are used, have superior structure driven by superior mechanism. Moreover, as an embodiment of the application, the lamps can be installed on the battens 80 and 800 mounted by screws 70 and 700 on the ceiling with an opening made in the center of the plate lamps and circular plate lamps, thereby forming flat-top or ceiling lamps or light fixtures.

From theory to practice, the date is approaching when LED semi-conductor lighting fixtures substitute traditional incandescent lamps and compact fluorescent lamps. By getting rid of the limitations by traditional lighting fixtures, we are marching towards this rugged path and have made some achievements so that the energy-saving, environmentfriendly and highly luminous LED semiconductor lighting fixtures can be used the people in the world in near future.

The invention claimed is:

1. A light strip, comprising:

a plurality of LED multi-chip bonding die sections, wherein each section comprises a plurality of LED multi-chip bonding dies and a current-limiting resistor in series connection, and the bonding die sections are in parallel connection;

a strip circuit board, wherein one surface of the circuit board is divided into lower and upper parts by height; on the upper part is equipped with power terminal through-hole contact(s), weld joint(s) for the current-limiting resistor, and weld joint(s) for a connection cable of negative pole, while on the lower part is equipped with LED power electrode pad(s) for the plurality of LED multi-chip bonding dies; a heat-dissipating copper sheet is equipped on a part of another surface of the circuit board where the sheet is placed back-to-back with the LED power electrode pad(s);

the LED multi-chip bonding dies for each bonding die section are installed at a certain interval on the LED power electrode pad(s) mounted on the circuit board, wherein the positive and negative poles of the LED multi-chip bonding dies are connected with the through-hole contact(s) of the power terminal and the weld joint(s) for the connection cable of negative pole, respectively; and the current-limiting resistor is welded with the weld joint(s) for the current-limiting resistor and is connected between two LED multi-chip bonding dies connected in series in each bonding die section;

the LED power electrode pad(s) is a copper pad and a partial area of the LED power electrode pad(s) is uncovered and exposed;

the circuit board is a compound board or PCB, in which a bakelite plate used as a base plate and a back side of the bakelite plate is covered with the heat-dissipating copper sheet used as a heat radiating fin and a front side of the bakelite plate is covered with a copper sheet used as the LED power electrode pad(s);

wherein each of the plurality of LED multi-chip bonding dies comprises:

a packaging enclosure made of high temperature-resistant plastics or ceramics, in which a groove with an oval bottom used for mounting an LED emitting platform is located in a center of an upper surface of the packaging enclosure, the packaging enclosure having a center axis;

a plurality of LED chips mounted on the emitting platform and arranged in a straight line arrangement;

electrodes corresponding to the number of the plurality of LED chips, the electrodes are arranged on both sides of a lower surface of the packaging enclosure and symmetrically along the center axis when viewed from the lower surface of the packaging enclosure, the plurality of LED chips are connected with the electrodes via lead wires of the plurality of LED chips, and the electrodes extend respectively from the lower surface of the packaging enclosure upward to side walls of the packaging enclosure;

a packaging cover formed by silicone gel that is filled in the groove and covers the plurality of LED chips; and wherein the plurality of LED chips mounted on the emitting platform in the straight line arrangement have 2 to 8 chips and each of the plurality of LED chips having a square shape when viewed from the upper surface, wherein a distance between centers of two neighboring chips is 0.5-1.1 mm and the plurality of LED chips are aligned with the center axis of the packaging enclosure when viewed from the upper surface.

2. The light strip of claim 1, wherein the current-limiting resistor has a suspended weld leg on the weld joint(s) for the current-limiting resistor.

3. The light strip of claim 1, wherein the upper part equipped with through-hole contact(s) for the power terminal, weld joint(s) for the current-limiting resistor, and weld joint(s) for the connection cable of negative pole occupies 20-50% of the surface of the circuit board; and the lower part equipped with LED power electrode pad(s) occupies 80-50% of the surface of the circuit board; wherein the upper part and the lower part combine to occupy 100% of the surface.

4. The light strip of claim 1, wherein the through-hole contact(s) for the power terminal, weld joint(s) for the current-limiting resistor, and weld joint(s) for the connection cable of negative pole are on a through-hole pad.

5. A lamp or lighting fixture comprising the light strip of claim 1.

6. The light strip of claim 1, wherein each electrode is horizontally distributed on the lower surface and has an equal surface area when viewed from the lower surface of the packaging enclosure.

7. The light strip of claim 1, wherein each electrode forms a right angle between the lower surface and a respective side wall and has an equal surface area when viewed from the lower surface of the packaging enclosure.

8. The light strip of claim 1, wherein the external shape of the packaging enclosure is square or rectangular and the groove of the packaging enclosure is square, rectangular or oval when viewed from the upper surface of the packaging enclosure.

9. The light strip of claim 1, wherein the plurality of LED chips are paired in parallel, wherein the lead wires in parallel connection are welded to the electrodes, respectively.

10. The light strip of claim 1, further comprising: a key groove equipped at the lower surface of the packaging enclosure and between the electrodes.

* * * * *